US012757524B2

(12) United States Patent
Khoury et al.

(10) Patent No.: US 12,757,524 B2
(45) Date of Patent: Oct. 6, 2026

(54) SUBSTRATE PROCESSING FOR GaN GROWTH

(71) Applicant: Applied Materials, Inc., Santa Clara, CA (US)

(72) Inventors: Michel Khoury, Mountain View, CA (US); Ria Someshwar, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 419 days.

(21) Appl. No.: 17/696,447

(22) Filed: Mar. 16, 2022

(65) Prior Publication Data

US 2023/0124414 A1 Apr. 20, 2023

Related U.S. Application Data

(63) Continuation-in-part of application No. 17/507,134, filed on Oct. 21, 2021, now Pat. No. 12,557,436.

(60) Provisional application No. 63/255,825, filed on Oct. 14, 2021.

(51) Int. Cl.

*H10H 20/01* (2025.01)
*H10H 20/818* (2025.01)
*H10H 20/825* (2025.01)

(52) U.S. Cl.

CPC ...... *H10H 20/01335* (2025.01); *H10H 20/01* (2025.01); *H10H 20/818* (2025.01); *H10H 20/825* (2025.01)

(58) Field of Classification Search

None

See application file for complete search history.

(56) References Cited

U.S. PATENT DOCUMENTS

2001/0049201 A1 12/2001 Park
2007/0259534 A1 11/2007 Reid et al.
2010/0087045 A1 4/2010 Shimomura et al.
2011/0162706 A1 7/2011 Borden et al.
2014/0346541 A1 11/2014 Hertkorn et al.
2015/0076507 A1* 3/2015 Hertkorn ........... H01L 21/02661 438/479
2015/0187985 A1* 7/2015 Hertkorn ................. H01L 33/10 257/98
2015/0279672 A1 10/2015 Hyot et al.
2017/0005223 A1 1/2017 Bergbauer et al.

(Continued)

FOREIGN PATENT DOCUMENTS

CN 101471245 A 7/2009
CN 104201196 A 12/2014

(Continued)

OTHER PUBLICATIONS

English translation (Year: 2021).*

(Continued)

*Primary Examiner* — Bradley Smith

(74) *Attorney, Agent, or Firm* — Kilpatrick Townsend & Stockton LLP

(57) ABSTRACT

Exemplary semiconductor structures may include a silicon-containing substrate. The structures may include a layer of a metal nitride overlying the silicon-containing substrate. The layer of the metal nitride may include a plurality of features. The structures may include a gallium nitride structure overlying the layer of the metal nitride.

19 Claims, 5 Drawing Sheets

(56) References Cited

U.S. PATENT DOCUMENTS

| | | | | |
|---|---|---|---|---|
| 2017/0054025 | A1 | 2/2017 | Dargis et al. | |
| 2017/0110630 | A1* | 4/2017 | Kawakami | H01L 33/007 |
| 2017/0229611 | A1 | 8/2017 | Shatalov et al. | |
| 2017/0278961 | A1 | 9/2017 | Hill et al. | |
| 2017/0338110 | A9 | 11/2017 | Kumar | |
| 2019/0249328 | A1 | 8/2019 | D'evelyn et al. | |
| 2020/0083167 | A1* | 3/2020 | LaRoche | H01L 29/475 |
| 2021/0009461 | A1* | 1/2021 | Sayce | C01B 33/12 |
| 2021/0210651 | A1 | 7/2021 | Bergbauer et al. | |

FOREIGN PATENT DOCUMENTS

| | | | |
|---|---|---|---|
| CN | 113044816 | A | 6/2021 |
| CN | 113224155 | A | 8/2021 |
| CN | 113540295 | A | * 10/2021 |
| TW | 558843 | B | 10/2003 |
| TW | I257142 | B | 6/2006 |
| TW | 201624685 | A | 7/2016 |
| WO | 2015/013746 | A1 | 2/2015 |
| WO | 2017129481 | A1 | 8/2017 |
| WO | 2020186205 | A1 | 9/2020 |

OTHER PUBLICATIONS

"Uranium Nitrides", Available online at: https://en.wikipedia.org/wiki/Uranium_nitrides, Accessed from internet on Aug. 1, 2024, 6 pages.

Siller et al., "Gold Nitride: Preparation and Properties", Research Gate, Topics in Catalysis, vol. 52, No. 11, Oct. 2009, pp. 1604-1610.

Application No. PCT/US2022/045974, International Search Report and the Written Opinion, Mailed on Feb. 7, 2023, 9 pages.

Application No. PCT/US2022/045976, International Search Report and the Written Opinion, Mailed on Feb. 3, 2023, 12 pages.

U.S. Appl. No. 17/507,134, Final Office Action, Mailed on Jan. 21, 2025, 8 pages.

Office Action for Application No. TW111138577, Mailed on Jan. 22, 2025, 8 pages.

Chaaben et al., "High Resolution X-ray Diffraction of GaN Grown on Si (1 1 1) by MOVPE", Applied Surface Science, vol. 253, No. 1, Jul. 10, 2006, pp. 241-245.

Application No. EP22881584.1 , Extended European Search Report, Mailed on Oct. 6, 2025, 9 pages.

U.S. Appl. No. 17/507,134 Notice of Allowance mailed Oct. 21, 2025, 5 pages.

U.S. Appl. No. 17/507,134 , Final Office Action, Mailed on Jun. 5, 2025, 8 pages.

Application No. EP22881585.8 , Extended European Search Report, Mailed on Jul. 4, 2025, 9 pages.

Application No. TW113145658 , Office Action, Mailed on Jun. 30, 2025, 3 pages.

* cited by examiner

SUBSTRATE PROCESSING FOR GaN GROWTH

CROSS-REFERENCE TO RELATED APPLICATIONS

The present Application is a continuation-in-part of U.S. patent application Ser. No. 17/507,134, filed Oct. 21, 2021, which claims the benefit of priority to U.S. Provisional Patent Application No. 63/255,825, filed Oct. 14, 2021. The entire contents of all above identified applications are hereby incorporated by reference in their entirety for all purposes.

TECHNICAL FIELD

The present technology relates to semiconductor processing and materials. More specifically, the present technology relates to formation processes and materials for light-emitting diode structures and components.

BACKGROUND

LED panels or devices may be formed with a number of light sources that operate as pixels on the device. The pixels may be formed with monochromatic light sources that are then delivered through a conversion layer to produce color, or the pixels may each have individual color light sources formed. In either scenario, any number up to millions of light sources may be formed and connected for operation. While there have been considerable developments to light sources used in LED panels, producing the structures may still be prone to defects causing reduced performance.

Thus, there is a need for improved systems and methods that can be used to produce high quality devices and structures. These and other needs are addressed by the present technology.

SUMMARY

Exemplary semiconductor structures may include a silicon-containing substrate. The structures may include a layer of a metal nitride overlying the silicon-containing substrate. The layer of the metal nitride may include a plurality of features. The structures may include a gallium nitride structure overlying the layer of the metal nitride.

In some embodiments, the silicon-containing substrate may be or include silicon. The metal nitride may be selected from the group including or consisting of aluminum nitride, hafnium nitride, and niobium nitride. The gallium nitride structure may extend into the plurality of features of the layer of the metal nitride. The structures may include an oxygen-containing layer disposed between the layer of the metal nitride and the gallium nitride structure. The oxygen-containing layer may include aluminum and oxygen. The oxygen-containing layer may include gallium, nitrogen, or both. The layer of the metal nitride may include a plurality of crystalline columns separated by amorphous material. Each of the plurality of features may be characterized by a depth of less than or about 100 nm.

Some embodiments of the present technology may encompass semiconductor structures. The structures may include a silicon substrate. A seed layer of a metal nitride may overly the silicon substrate. The seed layer of the metal nitride may define a plurality of recesses. A gallium nitride structure may overly the seed layer of the metal nitride. The gallium nitride structure may extend into the plurality of recesses defined in the seed layer of the metal nitride.

In some embodiments, the metal nitride may be selected from the group consisting of aluminum nitride, hafnium nitride, and niobium nitride. The structures may include an oxygen-containing layer disposed between the seed layer of the metal nitride and the gallium nitride structure. The oxygen-containing layer may include aluminum and oxygen. The oxygen-containing layer may include gallium. The oxygen-containing layer may include nitrogen. Each of the plurality of recesses may be characterized by a depth of less than or about 100 nm.

Some embodiments of the present technology may encompass semiconductor structures. The structures may include a silicon-containing substrate. The silicon-containing substrate may be or include silicon. The structures may include a layer of a metal nitride overlying the silicon-containing substrate. The layer of the metal nitride may be selected from the group consisting of aluminum nitride, hafnium nitride, and niobium nitride. The layer of the metal nitride may include a plurality of features. The structures may include a gallium nitride structure overlying the layer of the metal nitride. The gallium nitride structure may extend into the plurality of features defined in the layer of the metal nitride.

In some embodiments, the structures may include an oxygen-containing layer disposed between the layer of the metal nitride and the gallium nitride structure.

Such technology may provide numerous benefits over conventional systems and techniques. For example, the present technology may provide methods of forming gallium-containing materials characterized by reduced dislocations or defects extending through the materials. Additionally, the present technology may afford the ability to utilize physical vapor deposition to produce seed layers for growing gallium-nitride materials. These and other embodiments, along with many of their advantages and features, are described in more detail in conjunction with the below description and attached FIGURES.

BRIEF DESCRIPTION OF THE DRAWINGS

A further understanding of the nature and advantages of the disclosed technology may be realized by reference to the remaining portions of the specification and the drawings.

Figure 1:
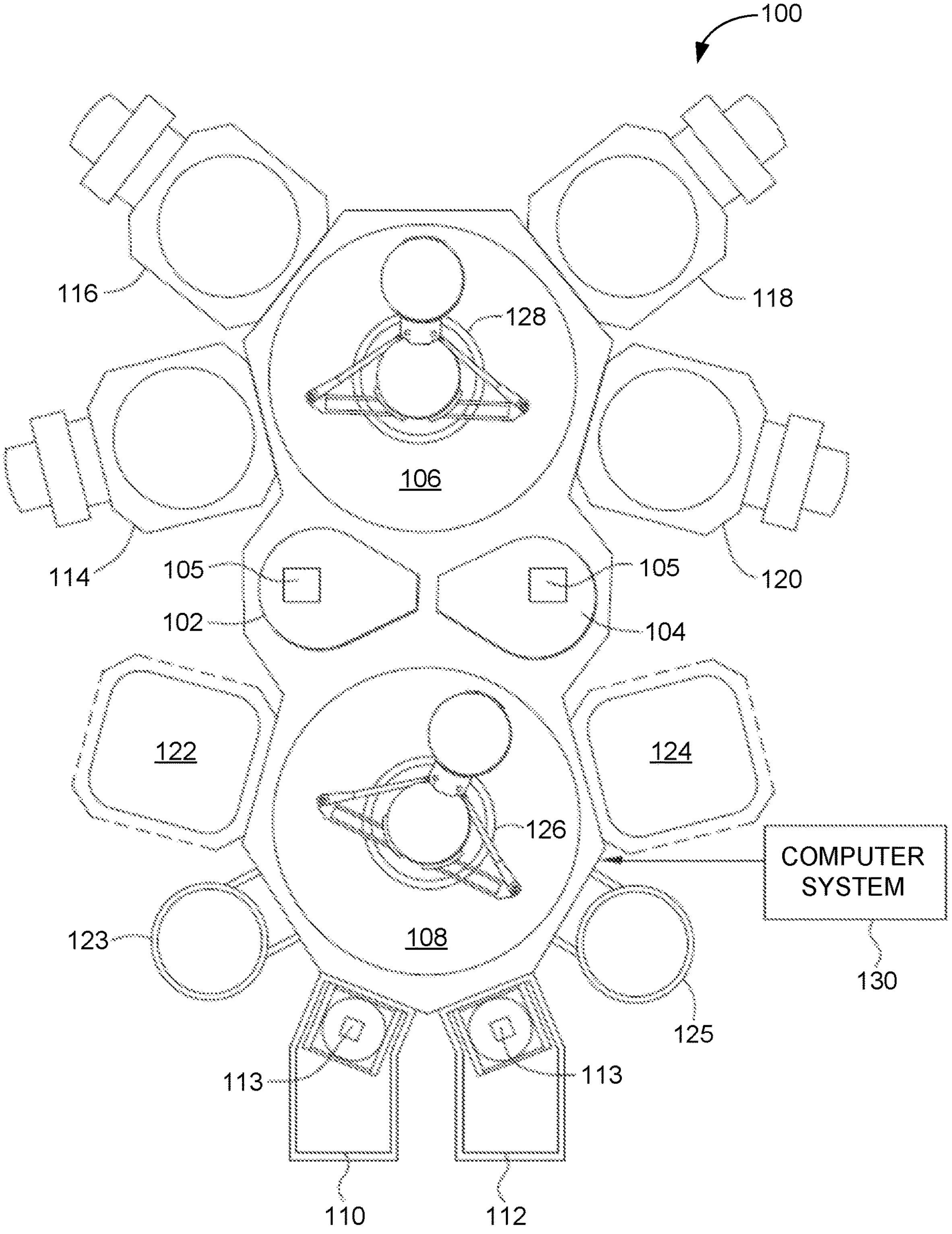
FIG. 1 shows a top plan view of one embodiment of an exemplary processing system according to some embodiments of the present technology.

Several of the FIGURES are included as schematics. It is to be understood that the FIGURES are for illustrative purposes, and are not to be considered of scale unless specifically stated to be of scale. Additionally, as schematics, the FIGURES are provided to aid comprehension and may not include all aspects or information compared to realistic representations, and may include exaggerated material for illustrative purposes.

In the appended FIGURES, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

LEDs may include semiconductor structures that emit light when current flows through the structure. Electrons in the semiconductor may recombine with electron holes, releasing energy in the form of photons. Many conventional LEDs are formed with a thick film, such as thicker than a micron, that may define quantum wells. Dislocations, such as threading dislocations or defects, may propagate through the material in the quantum well, such as from the underlying substrate, and may result in non-radiative recombination in the quantum well region, where the LED emits a phonon instead of a photon. Threading dislocations in conventional technologies may readily pass through to the surface of the quantum well, which may undesirably increase the non-radiative recombination. These dislocations may form or exist due to a number of aspects related to the growth or structural formation process, and the dislocations may carry through the subsequent device layers formed, including the LED active region, which may further reduce the efficiency of the device.

Conventional technologies may utilize complex and expensive processing operations to develop the quantum well material in an attempt to reduce dislocations, and may be limited to specific materials and processes for the structure. For example, metal-oxide chemical vapor deposition may be used to form both a seed layer over a substrate, as well as the subsequent material used for the quantum well. This process may be expensive and time consuming. However, conventional technologies have been incapable of utilizing alternative techniques to produce the seed layer, and dislocation density may still be unfavorably high. For example, physical vapor deposition may produce films characterized by reduced structural or film characteristics, which may prevent adequate growth of the quantum well material. As one non-limiting example, gallium nitride may be used as the quantum well material in some devices, and conventional technologies have been unable to grow this material on metal nitride seed layers produced by physical vapor deposition, which may be characterized by more poorly oriented crystal structures. Because of the structure of the metal nitride produced, the polar gallium nitride material may form crystals characterized by mixed polarity, with regions of gallium-polar growth and regions of nitrogen-polar growth. This may prevent the structure from appropriately coalescing to form a quantum well, and the device may fail.

The present technology may overcome issues associated with conventional technologies, and may cure or otherwise overcome the previous limitations of physical vapor deposition nitride materials. By performing one or more treatments on a physical vapor deposition seed layer, an oxygen interface may be produced, which may facilitate improved growth of gallium-containing materials. Accordingly, dislocations or defects may be controlled or minimized, which may improve device quality and performance. Although the remaining disclosure will routinely identify specific LED materials and processes utilizing the disclosed technology, it will be readily understood that the systems and methods are equally applicable to a variety of materials and processes as may occur for producing displays. Accordingly, the technology should not be considered to be so limited as for use with LED processes alone. After discussing an exemplary chamber system that may be used according to some embodiments of the present technology, methods for producing high-quality structures will be described.

FIG. 1 illustrates a top plan view of a multi-chamber processing system 100, which may be specifically configured to implement aspects or operations according to some embodiments of the present technology. The multi-chamber processing system 100 may be configured to perform one or more fabrication processes on individual substrates, such as any number of semiconductor substrates, for forming semiconductor devices. The multi-chamber processing system 100 may include some or all of a transfer chamber 106, a buffer chamber 108, single wafer load locks 110 and 112, although dual load locks may also be included, processing chambers 114, 116, 118, 120, 122, and 124, preheating chambers 123 and 125, and robots 126 and 128. The single wafer load locks 110 and 112 may include heating elements 113 and may be attached to the buffer chamber 108. The processing chambers 114, 116, 118, and 120 may be attached to the transfer chamber 106. The processing chambers 122 and 124 may be attached to the buffer chamber 108. Two substrate transfer platforms 102 and 104 may be disposed between transfer chamber 106 and buffer chamber 108, and may facilitate transfer between robots 126 and 128. The platforms 102, 104 can be open to the transfer chamber and buffer chamber, or the platforms may be selectively isolated or sealed from the chamber to allow different operational pressures to be maintained between the transfer chamber 106 and the buffer chamber 108. Transfer platforms 102 and 104 may each include one or more tools 105, such as for orientation or measurement operations.

The operation of the multi-chamber processing system 100 may be controlled by a computer system 130. The computer system 130 may include any device or combination of devices configured to implement the operations described below. Accordingly, the computer system 130 may be a controller or array of controllers and/or a general purpose computer configured with software stored on a non-transitory, computer-readable medium that, when executed, may perform the operations described in relation to methods according to embodiments of the present technology. Each of the processing chambers 114, 116, 118, 120, 122, and 124 may be configured to perform one or more process steps in the fabrication of a semiconductor structure. More specifically, the processing chambers 114, 116, 118, 120, 122, and 124 may be outfitted to perform a number of substrate processing operations including dry etch processes, cyclical layer deposition, atomic layer deposition, chemical vapor deposition, physical vapor deposition, etch, pre-clean, degas, orientation, among any number of other substrate processes.

Figure 2:
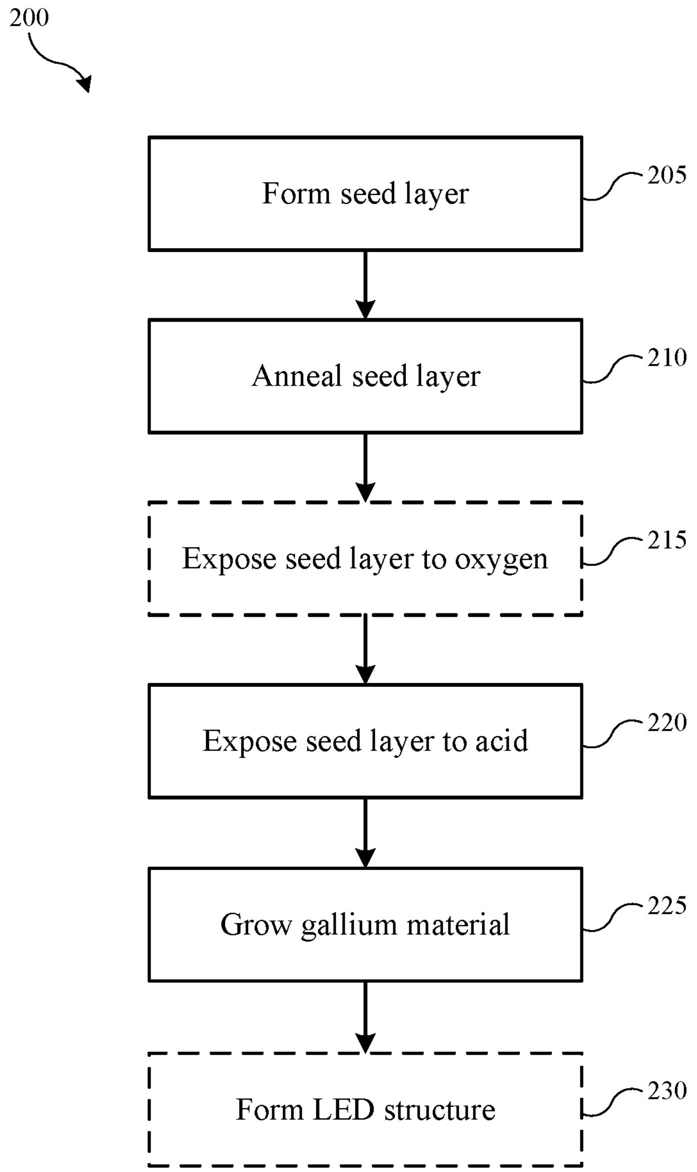
FIG. 2 shows selected operations in a method of forming a semiconductor structure according to some embodiments of the present technology.

FIG. 2 illustrates selected operations of a semiconductor processing method 200. Method 200 may include one or more operations prior to the initiation of the method, including front end processing, deposition, etching, polishing, cleaning, or any other operations that may be performed prior to the described operations. For example, in some embodiments a degas or other preparatory operation may be performed on a substrate, such as silicon or sapphire substrate, to prepare the substrate for deposition. The method may include a number of optional operations, which may or may not be specifically associated with some embodiments of methods according to the present technology. For example, many of the operations are described in order to provide a broader scope of the structural formation, but are not critical to the technology, or may be performed by alternative methodology as will be discussed further below. Method 200 describes operations shown schematically in FIGS. 3A-3C, the illustrations of which will be described in conjunction with the operations of method 200. It is to be understood that the figures illustrate only partial schematic views, and a substrate may contain any number of sections having aspects as illustrated in the FIGURES, as well as alternative structural aspects that may still benefit from aspects of the present technology.

Figure 3A:
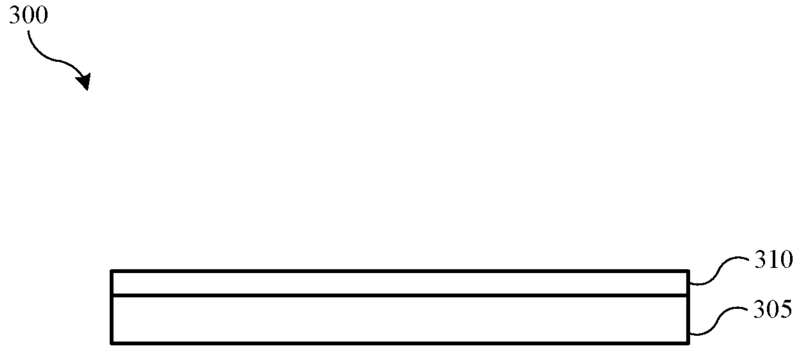
FIGS. 3A-3C illustrate schematic views of a device developed according to some embodiments of the present technology.

Method 200 may involve optional operations to develop the structure to a particular fabrication operation. As illustrated in FIG. 3A, a substrate 305 may be used to facilitate formation of a number of structures utilized in LED formation or other semiconductor processing. Although only two aspects are illustrated, it is to be understood that a substrate may have hundreds, thousands, millions, or more aspects, and which may be of any size. Substrate 305 may be any substrate on which structures may be formed, such as silicon-containing materials, aluminum materials, including sapphire, or any other materials as may be used in display or semiconductor fabrication. The substrate 305 may have various dimensions, such as 200 mm or 300 mm diameter wafers, as well as rectangular or square panels. The substrate 305 may be cleaned or processed in preparation for depositing one or more layers of material on the substrate for producing a structure, such as an LED, for example, although any number of other semiconductor structures may similarly benefit from aspects of the present technology.

A nitrogen-containing nucleation or seed layer 310 may be formed overlying the substrate 305 at operation 205. Although the remaining disclosure will regularly discuss formation on or with an aluminum nitride seed layer, it is to be understood that the technology is not so limited. In some embodiments, the seed layer may be or include gallium nitride, niobium nitride, hafnium nitride, aluminum nitride, or any other metal nitride on which gallium-containing materials or other materials may be formed. Seed layer 310 may be formed in any number of ways, such as by metal-oxide chemical vapor deposition, although in some embodiments, the seed layer may be formed by physical vapor deposition.

As noted above, conventional technologies have been incapable of utilizing physical vapor deposition for seed layer formation because the produced material is typically characterized by disorientation of the structure. Physical vapor deposition formation of the seed layer may provide unfavorable kinetics for gallium nitride growth, which may lead to any number of issues. The interface produced between the seed layer and subsequently formed gallium materials facilitates greater transmission of defects, as well as production of mixed polarity gallium nitride, which may detrimentally reduce efficiency and quality of the quantum well. Accordingly, conventional technologies have been constrained to utilizing more expensive technologies, such as e-beam or metal-oxide chemical vapor deposition. The present technology may overcome these issues by performing one or more techniques that may create a beneficial interface where an oxygen-containing material is formed, which may allow an improved growth of gallium-containing materials, such as gallium nitride.

For example, method 200 may include annealing the seed layer at operation 210. The anneal may be performed at high temperatures, which may improve the crystalline structure of the nitride seed layer, including at an exposed surface, and which may help to reduce or limit transmission of dislocations through the subsequently formed layers, and may facilitate improved growth of gallium materials. The anneal may be performed at a temperature of greater than or about 1,000° C., and may be performed at a temperature of greater than or about 1,150° C., greater than or about 1,200° C., greater than or about 1,250° C., greater than or about 1,300° C., greater than or about 1,350° C., greater than or about 1,400° C., greater than or about 1,450° C., greater than or about 1,500° C., greater than or about 1,550° C., greater than or about 1,600° C., or higher. However, depending on the substrate material, a lower temperature may be used, which may facilitate treatment of the nitride seed layer, but may protect the substrate. For example, in some embodiments, the substrate may be silicon, which may be damaged or melt at higher temperatures. Accordingly, in some embodiments, and depending on the substrate, the temperature may be maintained at less than or about 1,500° C., and may be maintained at less than or about 1,400° C., less than or about 1,300° C., or less.

The anneal may be performed for a period of time sufficient to improve the seed layer, and the anneal may be performed for greater than or about 30 minutes, greater than or about 60 minutes, greater than or about 90 minutes, greater than or about 120 minutes, greater than or about 150 minutes, greater than or about 180 minutes, or more. The time period may be related to the anneal temperature, where a higher temperature anneal may be performed for a reduced period of time, while producing similar effects. For example, while an anneal at 1,600° C. may be performed for a time period of less than or about 30 minutes, an anneal performed at a temperature of less than or about 1,200° C. may be performed for greater than or about 90 minutes. The anneal may be performed in any processing atmosphere, but in some embodiments the anneal may be performed in an inert atmosphere, such as a nitrogen atmosphere, an argon atmosphere, a helium atmosphere, among other non-reactive, oxygen-deprived, or other inert materials.

Figure 3B:
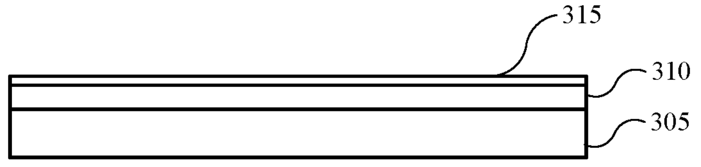

Subsequent to the anneal operation, in some embodiments the substrate with the annealed seed layer may be exposed to an oxygen-containing environment, such as by passing the substrate from a vacuum environment at optional operation 215. For example, a wet-etch chamber coupled with a side of a factory interface module, or on a different mainframe, may allow the substrate to be exposed to an oxygen-containing atmosphere. This may allow an amount of oxide to form on the seed layer, or may oxidize aspects of the seed layer. As shown in FIG. 3B, oxidation 315 may be formed overlying the seed layer. At operation 220, the seed layer and overlying oxidation region may be exposed to an acid, such as in a dip or other wet etch process. For example, in some embodiments the seed layer may be exposed to a halogen-containing wet etchant, such as a diluted hydrogen fluoride, as one non-limiting example. While the wet etchant may cause an amount of etching to be performed of the oxidation, in some embodiments an oxygen-containing material may be retained at least partially across the surface of the seed layer. This exposure may cause any number of effects to the oxide material, such as removing lower quality oxygen-containing material, or oxidation characterized by specific crystalline structures, while maintaining other oxide materials.

Figure 3C:
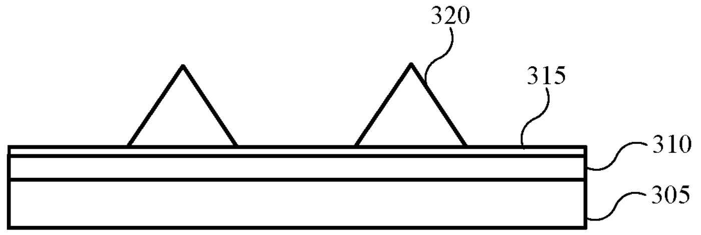

In embodiments where the substrate may be removed from a vacuum environment, the substrate may be delivered back to a processing environment, where a gallium-containing material may be grown at operation 225. The gallium-containing material, which may include gallium nitride, for example, may be grown by metal-oxide chemical vapor deposition, or by any other deposition or formation process. As shown in FIG. 3C, the gallium-containing material 320 may be characterized by discrete regions of a pyramidal shaped structure, although the process may facilitate growth of any structure including a continuous layer of gallium-containing material. The gallium-containing material may be grown overlying the oxide material remaining overlying the seed layer, which may facilitate growth of the gallium-containing material. By maintaining an amount of oxidation, and which may have been exposed to acid as previously noted, gallium nitride may be grown, which may be characterized by reduced dislocations extending through the materials. This may be due to increased or faster coalescing of the gallium nitride material, which may trap dislocations or defects closer to the seed layer, and which may not extend through the quantum well materials.

The structure produced may be characterized by an oxygen-containing layer disposed between the seed layer, such as a layer of a metal nitride as previously described, and the gallium-containing material, such as gallium nitride, for example. By incorporating an oxygen-containing layer, gallium nitride growth may occur with a more metal-polar characteristic, and with reduced defects. The oxygen-containing layer may be characterized by any number of elements incorporated in one or more crystal structures. For example, the oxygen-containing layer may include one or more of aluminum, oxygen, gallium, or nitrogen. The layer may also be characterized by any number of crystal structures, which may improve the growth characteristics of gallium nitride. For example, gallium nitride may be characterized by a hexagonal crystal structure, which may show improved growth on more similar crystal structures. As one non-limiting example, gallium nitride may show improved growth on sapphire-like aluminum oxide, which may be in part due to the hexagonal crystal structure of sapphire. Accordingly, by exposing the oxidation layer to acid, certain oxide structures may be altered or removed, which may allow to remain oxide structures that may facilitate growth of gallium nitride that may be characterized by improved and earlier coalescence, and which may reduce dislocations through the material.

Oxide materials that may remain may include any of the elements noted above, and may have at least some regions characterized by a more aluminum oxide nature, which may be characterized by one or more crystalline structures. For example, oxide material that may be formed by the oxidation may be characterized by any number of aluminum oxide crystal structures, such as alpha-aluminum oxide, gamma-aluminum oxide, delta-aluminum oxide, theta-aluminum oxide, iota-aluminum oxide, kappa-aluminum oxide, or sigma-aluminum oxide. The formation may produce any number of lattice parameters of any of these materials, and may provide any number of crystal structures. For example the oxide or material formed may be characterized by features that may relate to a hexagonal crystal structure, a cubic crystal structure, a tetragonal crystal structure, a monoclinic crystal structure, and/or an orthorhombic crystal structure. The exposure to acid may also allow the oxide to form openings exposing regions of the aluminum nitride, which may allow gallium nitride to form through the opening pattern of the oxide layer. This may allow improved and controlled growth of gallium nitride, allowing the crystals to more quickly coalesce locally at each section, such as sections 320, and which may reduce propagation of dislocations from the seed layer through the quantum well or gallium-containing material.

By performing treatments according to some embodiments of the present technology, dislocation density through the gallium-containing material may be reduced. For example, the present technology may produce regions of gallium nitride of any thickness, such as from dozens of nanometers to several micrometers or more, and which may be characterized by a dislocation density of less than or about 8.0 E9/cm$^2$, and which may be characterized by a dislocation density of less than or about 7.5 E9/cm$^2$, less than or about 7.0 E9/cm$^2$, less than or about 6.5 E9/cm$^2$, less than or about 6.0 E9/cm$^2$, less than or about 5.5 E9/cm$^2$, less than or about 5.0 E9/cm$^2$, or less. This may improve efficiency of operation, and may improve device performance.

After forming the gallium-nitride material, method 200 may further include forming an LED structure at optional operation 230, such as in embodiments in which the gallium-nitride material may be used as a quantum well for an LED structure. Embodiments of forming an LED structure may include forming a p-doped layer over the gallium-containing material. The p-doped layer may be made from one or more of gallium nitride, aluminum-indium-gallium-nitride, indium-gallium-nitride, and aluminum-gallium nitride. In some embodiments, the p-doped layer may include gallium-free, indium-and-nitride materials such as indium nitride, and aluminum-indium-nitride, among other gallium-free nitride materials. Forming the LED structure may additionally include forming contact pads on the layers of the structure. The contact pads may be formed of one or more electrically conductive materials such as copper, aluminum, tungsten, chromium, nickel, silver, gold, platinum, palladium, titanium, tin, and/or indium, among other conductive materials. Any additional or alternative operations or processes for forming an LED structure may be included, as one of skill would appreciate.

The LED formation may also include forming a light conversion region on the LED structure. The light conversion region may absorb the light emitted by the LED structure and emit light at a longer wavelength from an LED display. In some embodiments, the light conversion region may be a quantum-dot layer, which may be operable to convert a shorter wavelength of light from the LED structure into one of red, green, or blue light. Additional quantum-dot layers may be formed on other LED structures to convert the shorter wavelength of light emitted by the LED structure into another of the red, green, and blue colored light. In some embodiments, combinations of three quantum-dot layers on three LED structures may form an LED pixel that includes subpixels operable to emit red, green, and blue light. In some embodiments, sequential operations may form a red quantum dot layer in one of the subpixels of each LED pixel, a green quantum dot layer in another one of the subpixels, and a blue quantum dot layer in still another one of the subpixels. Following the formation of the blue quantum dot, each LED pixel in the array of LED pixels may include red, green, and blue subpixels.

Figure 4:
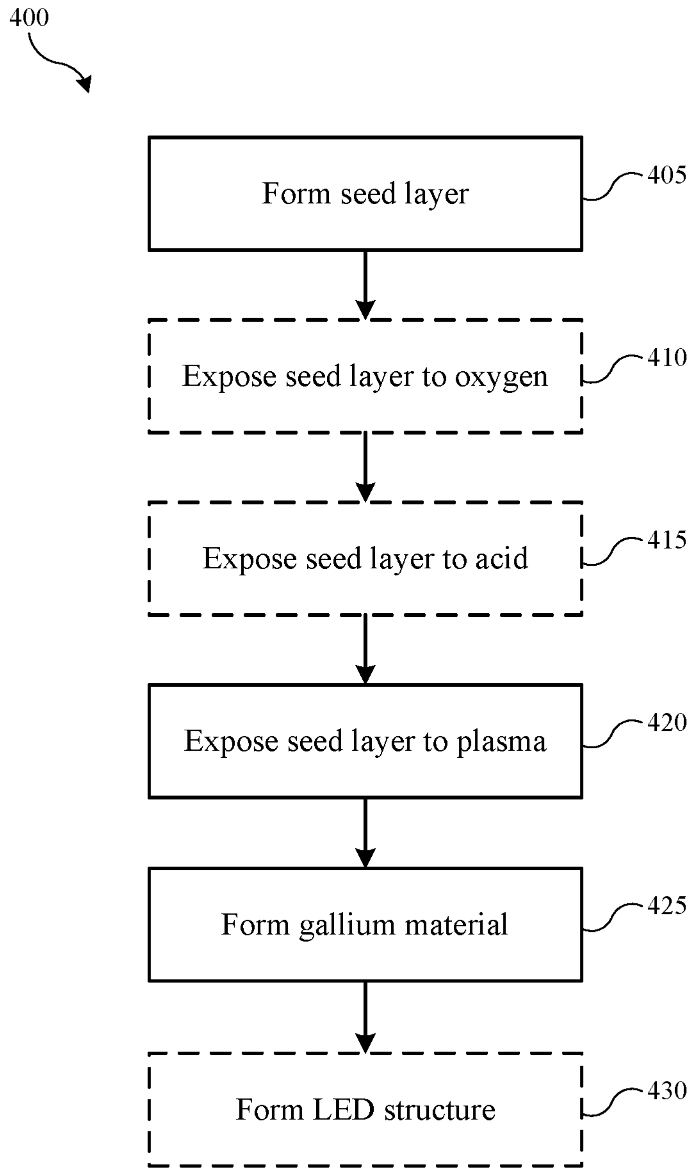
FIG. 4 shows selected operations in a method of forming a semiconductor structure according to some embodiments of the present technology.

The present technology may also encompass formation of oxygen-containing layers as previously described, which may be produced by additional or alternative methods. FIG. 4 illustrates selected operations of a semiconductor processing method 400. Method 400 may include any process or operation as previously described with respect to method 200, and method 400 may be used to produce any structure as discussed above or illustrated in the previous figures.

Method 400 may additionally or alternatively utilize a plasma processing operation to form an oxygen-containing region, and which may or may not utilize a break in vacuum as previously described.

For example, method 400 may include formation of a seed layer at operation 405, such as a nitride of any metals previously described, and which may be produced by physical vapor deposition in some embodiments. In some embodiments, the process may include exposing the substrate and seed layer to oxygen at optional operation 410, such as by removing the substrate from the vacuum environment. The substrate may be exposed to acid at optional operation 415, such as previously described, and then may be delivered back to the vacuum environment for further processing. At operation 420, the method may include exposing the seed layer to an oxygen-containing plasma. Although method 400 is shown with the oxygen plasma exposure occurring subsequent to the optional acid exposure, in some embodiments the optional operations 410 and 415 may be performed subsequent to the exposure to plasma.

During the plasma exposure, oxygen radicals or plasma effluents may be generated and delivered to the substrate. The plasma effluents may contact the seed layer and form an oxygen-containing layer or material regions as previously described. The exposure may incorporate oxygen into the structure being developed, and may produce a layer including any of the features, properties, aspects, or characteristics as previously described for an oxygen-containing material, and which may include any of the elements previously noted. The process may include generation of oxygen plasma either locally or remotely from a processing region in which a substrate is disposed. The plasma may be generated from any oxygen-containing material such as diatomic oxygen, ozone, nitrous oxide, nitric oxide, or any other oxygen-containing material, and in some embodiments ozone may be used with or without plasma generation. The seed layer may be exposed to oxygen radical species or plasma effluents for a period of time greater than or about 5 minutes, and may be exposed for greater than or about 10 minutes, greater than or about 15 minutes, greater than or about 20 minutes, greater than or about 25 minutes, greater than or about 30 minutes, or more. This may produce an oxygen-containing material at the surface of the seed layer as previously described, and which may produce a more metal-polar gallium-containing material. At operation 425, a gallium-containing material may be formed over the oxygen-containing layer, which may be a gallium nitride material formed as previously described. In some embodiments, an LED structure may be formed at optional operation 430 as previously described.

FIGS. 5A-5D illustrate schematic views of a device 500 developed according to some embodiments of the present technology. For example, the device 500 illustrated in FIGS. 5A-5C may be developed according to method 200 or 400. Device 500 may be similar to and may share any characteristics or features of the device illustrated in FIGS. 3A-3C. For example, a substrate 505, which may be the same or similar to substrate 305 and may include any features discussed with regard to substrate 305, may be used to facilitate formation of a number of structures utilized in LED formation or other semiconductor processing.

Figure 5A:
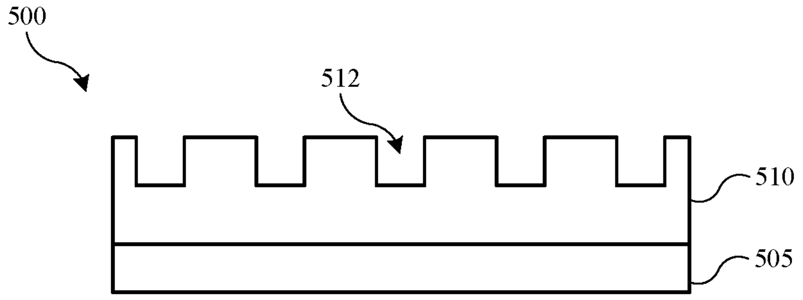
FIG. 5A-5D illustrate schematic views of a device developed according to some embodiments of the present technology.

A layer of a metal nitride 510 may overly the substrate 505. The layer of the metal nitride 510 may be similar to nitrogen-containing nucleation or seed layer 310 and may include any features discussed with regard to nitrogen-containing nucleation or seed layer 310. As illustrated in FIG. 5A, the layer of the metal nitride 510 may include or define a plurality of features 512, which may also be referred to as recesses. The features 512 may be formed in the layer of the metal nitride 510 and may be separated by metal nitride material characterized by a columnar shape. The columnar shape of the metal nitride may occur during formation of the metal nitride. The columnar shape may not be inherent and may not be due to any patterning or removal processes. The metal nitride material separating the features 512 may be crystalline metal nitride material. The features 512 may be void of metal nitride material or may be amorphous metal nitride material. Each of the plurality of recesses or features 512 may be characterized by a depth of less than or about 100 nm. For example, each of the plurality of recesses or features 512 may be characterized by a depth of less than or about 90 nm, less than or about 80 nm, less than or about 70 nm, less than or about 60 nm, less than or about 50 nm, less than or about 40 nm, less than or about 30 nm, less than or about 20 nm, less than or about 10 nm, less than or about 7 nm, less than or about 5 nm, less than or about 3 nm, or less. The plurality of recesses or features 512 may be characterized by a width of between about 1 nm and about 100 nm. The dimensions of the plurality of recesses or features 512 may be dependent, at least in part, on the temperature during formation and the thickness of the layer.

The features 512 may be formed by tuning process conditions during the formation of the layer of the metal nitride 510. For example, the layer of the metal nitride 510 may be deposited via plasma vapor deposition at high temperatures. At lower temperatures, the metal nitride material separating the features 512 may not characterized by a columnar shape that is vertically straight. If the columnar metal nitride material is not vertically straight, subsequent nucleation of material on the layer of the metal nitride 510 may similarly not be vertical as the material may nucleate from the features 512, which may cause defects in final structures or devices. By finely tuning the formation of the layer of the metal nitride 510, columnar growth and a width of the features 512 may be controlled, which may lead to ideal nucleation of material on the layer of the metal nitride 510.

Figure 5B:
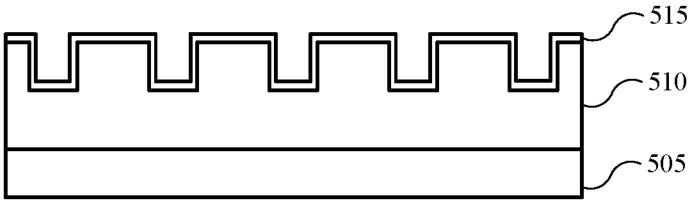

Similar to the device illustrated in FIGS. 3A-3C, the device 500 may include an oxygen-containing layer 515 as illustrated in FIG. 5B. The oxygen-containing layer 515 may be the same or similar to oxidation 315 and may include any features discussed with regard to oxidation 315. The oxygen-containing layer 515 may be disposed between the layer of the metal nitride 510 and a gallium nitride structure 520, as further discussed below.

Figure 5C:
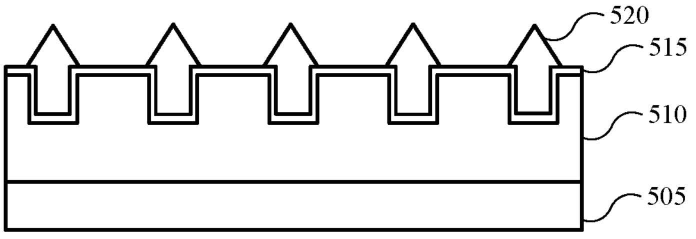
Figure 5D:
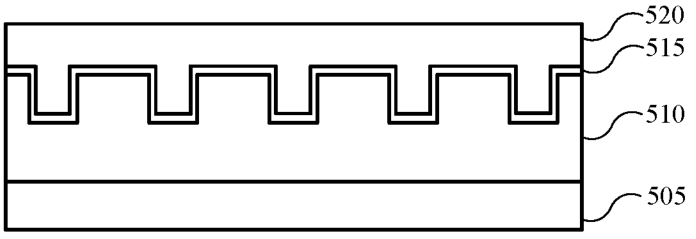

The gallium nitride structure 520 may overly the layer of the metal nitride 510. In embodiments with the oxygen-containing layer 515, the gallium nitride structure 520 may overly the oxygen-containing layer 515. While referred to as a gallium nitride structure, it is contemplated that the structure 520 may be any gallium-containing material. For example, the gallium nitride structure 520 may be the same or similar to gallium-containing material 320 and may include any features discussed with regard to gallium-containing material 320. As shown in FIGS. 5C-5D, the gallium nitride structure may extend into the plurality of features 512 defined in the layer of the metal nitride 510. When nucleating the gallium nitride structure 520, the growth may begin in the features 512 in the layer of the metal nitride 510. As previously discussed, vertical columnar material separating the features 512 may lead to an improved gallium nitride structure 520. As the gallium nitride structure 520 grows, material characterized by a plurality of pyramidal structures, as illustrated in FIG. 3C, may be present. The pyramidal structures may help to reduce or limit transmission of dislocations through the subsequently formed layer, and may facilitate improved growth of gallium materials. As the gallium nitride structure 520 continues to grow, the pyramidal structures of material may coalesce into a layer of material, as illustrated in FIG. 5D. Due at least in part to the features 512 in the layer of metal nitride 510, dislocations in the gallium nitride structure 520 may be reduced or mitigated.

Embodiments of the present technology include operations and structures that reduce or limit the amount of threading dislocations extending through the quantum well, which may otherwise reduce efficiency and performance of the resulting structure. By treating seed layers and forming an oxygen-containing structure as described above, the present technology may allow improved gallium-containing material growth, which may limit the prevalence and extension of dislocations through the materials. Accordingly, embodiments of the present technology may provide fabrication methods and resulting structures characterized by reduced amounts of threading dislocation for the improved efficiency of light-emitting diodes or other semiconductor structures.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either limit of the range, both limits of the range, or neither limit of the range are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms “a”, “an”, and “the” include plural references unless the context clearly dictates otherwise. Thus, for example, reference to “a precursor” includes a plurality of such precursors, and reference to “the layer” includes reference to one or more layers and equivalents thereof known to those skilled in the art, and so forth.

Also, the words “comprise(s)”, “comprising”, “contain(s)”, “containing”, “include(s)”, and “including”, when used in this specification and in the following claims, are intended to specify the presence of stated features, integers, components, or operations, but they do not preclude the presence or addition of one or more other features, integers, components, operations, acts, or groups.

The invention claimed is:

1. A semiconductor structure comprising:

a silicon substrate;

a layer of a metal nitride overlying the silicon substrate, wherein the metal nitride is selected from the group consisting of aluminum nitride, hafnium nitride, and niobium nitride, wherein the layer of the metal nitride comprises a plurality of features characterized by a depth of less than or about 100 nm, wherein a formation of the plurality of features occurs during formation of the layer of the metal nitride, and wherein the layer of the metal nitride is annealed at a temperature of greater than or about 1000° C. for a period of time greater than or about 60 minutes; and a gallium nitride structure overlying the layer of the metal nitride, wherein the gallium nitride structure is characterized by a dislocation density of less than or about 7 $E9/cm^2$.

2. The semiconductor structure of claim 1, wherein the metal nitride is aluminum nitride.

3. The semiconductor structure of claim 1, wherein the gallium nitride structure extends into the plurality of features of the layer of the metal nitride.

4. The semiconductor structure of claim 1, further comprising an oxygen-containing layer disposed between the layer of the metal nitride and the gallium nitride structure.

5. The semiconductor structure of claim 4, wherein the oxygen-containing layer comprises aluminum and oxygen.

6. The semiconductor structure of claim 5, wherein the oxygen-containing layer further comprises nitrogen.

7. The semiconductor structure of claim 1, wherein the layer of the metal nitride comprises a plurality of crystalline columns separated by amorphous material.

8. The semiconductor structure of claim 1, wherein each of the plurality of features is characterized by a depth of less than or about 50 nm.

9. The semiconductor structure of claim 1, wherein each of the plurality of features is characterized by a width of between about 1 nm and about 100 nm.

10. A semiconductor structure comprising:

a silicon substrate;

a seed layer of a metal nitride overlying the silicon substrate, wherein the metal nitride is selected from the group consisting of aluminum nitride, hafnium nitride, and niobium nitride, wherein the seed layer of the metal nitride defines a plurality of recesses characterized by a width of between about 1 nm and about 100 nm, and wherein the seed layer of the metal nitride is annealed at a temperature of greater than or about 1000° C. for a period of time greater than or about 60 minutes; and a gallium nitride structure overlying the seed layer of the metal nitride, wherein the gallium nitride structure extends into the plurality of recesses defined in the seed layer of the metal nitride, wherein the gallium nitride structure is characterized by a dislocation density of less than or about 7 $E9/cm^2$.

11. The semiconductor structure of claim 10, wherein the metal nitride is aluminum nitride.

12. The semiconductor structure of claim 10, further comprising an oxygen-containing layer disposed between the seed layer of the metal nitride and the gallium nitride structure.

13. The semiconductor structure of claim 12, wherein the oxygen-containing layer comprises aluminum and oxygen.

14. The semiconductor structure of claim 12, wherein the oxygen-containing layer further comprises nitrogen.

15. The semiconductor structure of claim 14, wherein the oxygen-containing layer further comprises gallium.

16. The semiconductor structure of claim 10, wherein each of the plurality of recesses is characterized by a depth of less than or about 100 nm.

17. The semiconductor structure of claim 10, wherein each of the plurality of recesses is characterized by a depth of less than or about 50 nm.

18. A semiconductor structure comprising:

a silicon substrate;

a layer of a metal nitride overlying the silicon substrate, wherein the metal nitride is selected from the group consisting of aluminum nitride, hafnium nitride, and niobium nitride, wherein the layer of the metal nitride is aluminum nitride, and wherein the layer of the metal nitride comprises a plurality of features characterized by a depth of less than or about 100 nm, and wherein the layer of the metal nitride is annealed at a temperature of greater than or about 1000° C. for a period of time greater than or about 60 minutes; and a gallium nitride structure overlying the layer of the metal nitride, wherein the gallium nitride structure extends into the plurality of features defined in the layer of the metal nitride, wherein the gallium nitride structure is characterized by a dislocation density of less than or about 7 $E9/cm^2$.

19. The semiconductor structure of claim 18, further comprising an oxygen-containing layer disposed between the layer of the metal nitride and the gallium nitride structure.

* * * * *